US005745593A

United States Patent [19]
Wahawisan et al.

[11] Patent Number: 5,745,593
[45] Date of Patent: Apr. 28, 1998

[54] METHOD AND SYSTEM FOR INSPECTING INTEGRATED CIRCUIT LEAD BURRS

[75] Inventors: Weerakiat Wahawisan, Carrollton; Rajiv Roy, Plano, both of Tex.

[73] Assignee: Semiconductor Technologies & Instruments, Inc., Dallas, Tex.

[21] Appl. No.: 686,296

[22] Filed: Jul. 25, 1996

Related U.S. Application Data

[63] Continuation of Ser. No. 367,987, Jan. 3, 1995, abandoned.

[51] Int. Cl.$^6$ ............................................. G06K 9/00
[52] U.S. Cl. ............................................. 382/146; 382/149
[58] Field of Search ................................... 382/141, 144, 382/145, 146, 147, 148, 149, 150, 151, 152, 143, 181, 190, 191, 192, 193, 194, 195, 209, 217, 224, 307, 308, 312, 317, 318, 319, 321, 323, 324, 205; 362/241, 237; 356/237; 359/794, 831; 348/126, 129, 127; 209/577; 250/223.6, 559.08, 559.46; 439/70, 330

[56] References Cited

U.S. PATENT DOCUMENTS

| | | | |
|---|---|---|---|
| 4,821,157 | 4/1989 | Birk et al. | 382/146 |
| 4,845,764 | 7/1989 | Ueda et al. | 382/146 |
| 4,847,911 | 7/1989 | Morimoto et al. | 382/146 |
| 4,851,902 | 7/1989 | Tezuka et al. | 382/146 |
| 4,910,598 | 3/1990 | Itakura et al. | 358/213.17 |
| 4,969,198 | 11/1990 | Batchelder et al. | 382/8 |
| 5,119,436 | 6/1992 | Holdgrafer | 382/146 |
| 5,250,809 | 10/1993 | Nakata et al. | 250/330 |

Primary Examiner—Leo Boudreau
Assistant Examiner—Bijan Tadayon
Attorney, Agent, or Firm—Akin, Gump, Strauss, Hauer & Feld, L.L.P.

[57] ABSTRACT

Burr inspection system (120) inspects an electrical lead for a burr (112) in association with the operation of a machine vision lead inspection system (10) and includes machine vision circuitry (50) for forming an image (70) of the electrical lead (72) using machine vision lead inspection system (10). Edge detecting instructions (120) associate with machine vision circuitry (50) for determining a plurality of edges (89, 91) associated with the electrical lead (72). Scan line determining instructions (128) calculate a plurality of scan lines (88, 90) each corresponding to the contour of a selected one of the plurality of edges (89, 91). The scan lines (88, 90) are separated from edges (88, 90) and image (70) by a preselected distance (92). Inspecting circuitry (130) inspects each scan line (88, 90) to detect whether a burr image (112) crosses the scan line (88, 90) to determine the presence of a burr on the electrical lead.

22 Claims, 5 Drawing Sheets

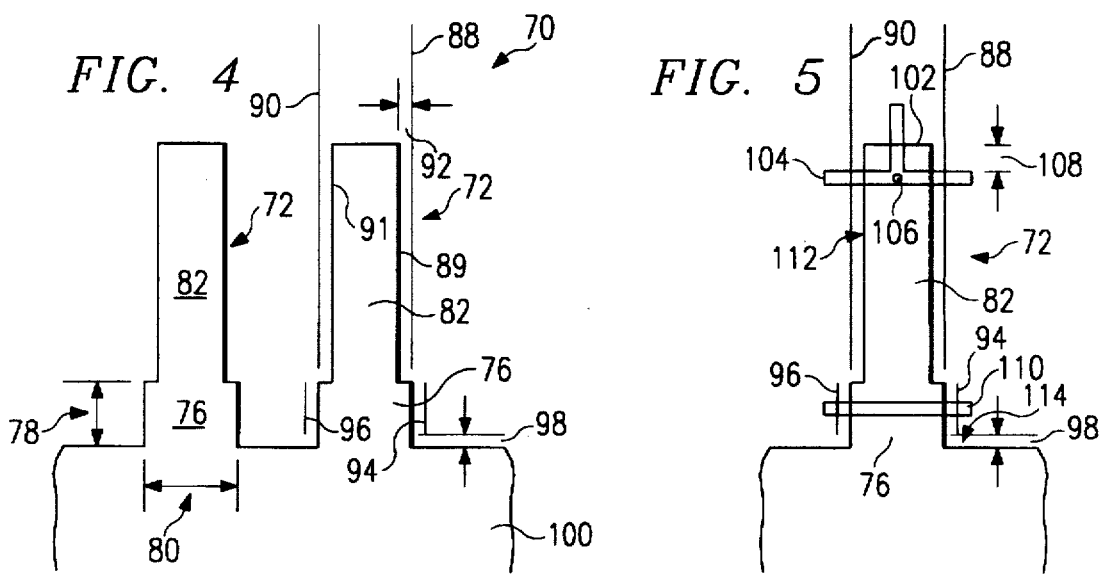
FIG. 4
FIG. 5
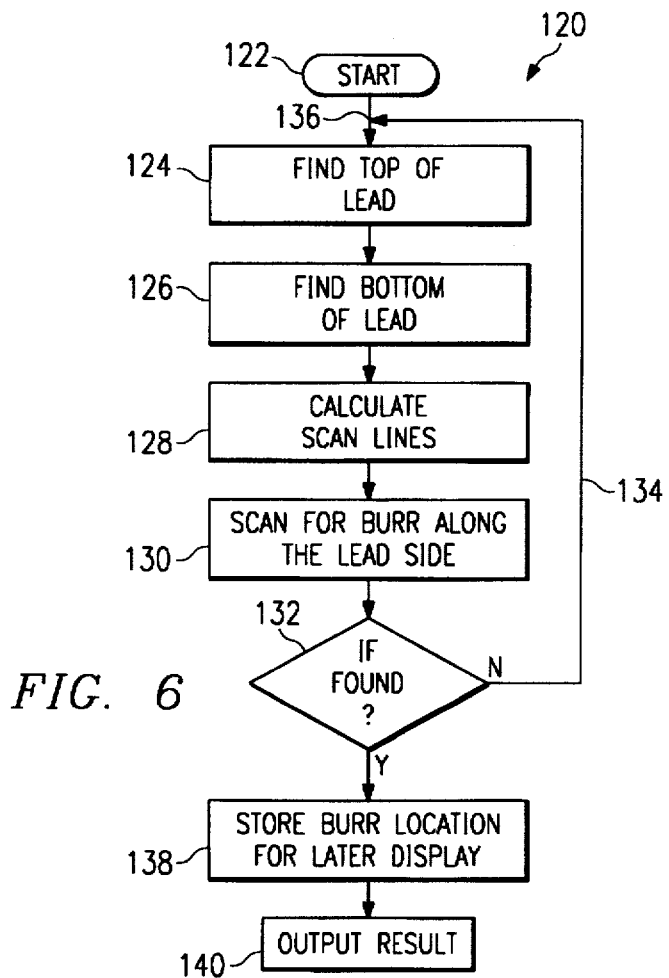
FIG. 6

FIG. 7

| 02/09/94 | LEAD INSPECTION SYSTEM AT4070 | | VERSION 7.2.0a |
|---|---|---|---|
| TOPVIEW TOLERANCE MENU ||||
| REWORK TOLERANCE | | REJECT TOLERANCE ||
| Tweeze Lead | : 0.00 | Tweeze Lead | : 4.00 |
| Tweeze Side | : 0.00 | Tweeze Side | : 4.00 |
| Cross Pkg | : 0.00 | Cross Pkg | : 6.00 |
| Lead Length | : 0.00 | Lead Length | : 0.00 |
| Lead Width | : 0.00 | Lead Width | : 0.00 |
| Dam Bar | : 0.00 | Dam Bar | : 0.00 |
| Heel Bend | : 0.00 | Heel Bend | : 0.00 |
| | | Burr Size | : 6.00 |
| | | Orientation Ck | : Disabled |

FIG. 8

| 02/08/94 | LEAD INSPECTION SYSTEM AT4070 | | VERSION 7.2.0a |
|---|---|---|---|
| INSPECTION PARAMETERS MENU ||||
| Machine Number | : 0 | Standoff Check | : on |
| Longer Side | : 1 | Footprint Check | : off |
| Pin 1 Orientation | : 1 | Top-View Inspect | : on |
| Yield Method | : all | Lead Length Check | : off |
| Rot. Before Sort | : 0 | Lead Width Check | : off |
| End Lead Check | : on | Dam Bar Check | : off |
| Yield Monitor... | | Heel Bend Check | : off |
| Foot Angle Check | : off | Burr Check | : off |
| Sweep Check | : on | Symbol Inspect | : off |
| Pitch Check | : on | | |

FIG. 9

| 02/09/94 | LEAD INSPECTION SYSTEM AT4070 | VERSION 7.2.0a |
|---|---|---|
| TOPVIEW DIAGNOSTICS MENU |||
| Terminal mode (press Ctrl-A to exit) |||
| > | | |

FIG. 10

```
Top View Data
                Side    Pin
    Sweep
    Lead Tweeze
    Side Tweeze
    X Package
    Lead length
    Lead width      142
    Dam bar
    Heel bend
    Burr Defect    nn      s1
```

FIG. 11

```
Tuesday 01/25/94  15:44:29
System            :    4070
Machine           :    0
Product ID        :    160_pin_qfp
Pin count         :    208
Dimensions        :    mils
Lot Number        :    0
------------------------------------
Total parts       :    2
Good parts        :    0
Reject parts      :    2
Rework Parts      :    0
Measurement errors :   0
```

|  | Reject | Rework | Rej Tol | Rew Tol |
|---|---|---|---|---|
| Coplanarity | 0 | 0 | 10.00 | 0.00 |
| Bent lead | 0 | 0 | 9.00 | 0.00 |
| Pitch | 0 | 0 | 0.00 | 0.00 |
| Max Standoff | 0 | 0 | 0.00 | 0.00 |
| Min standoff | 0 | 0 | 0.00 | 0.00 |
| Tweeze (pin) | 0 | 0 | 15.00 | 0.00 |
| Burr Defect | 2 | 0 | 6.00 | 0.00 |
| . . . . . . | . . | . . | . . . | . . . |
| . . . . . . | . . | . . | . . . | . . . |

METHOD AND SYSTEM FOR INSPECTING INTEGRATED CIRCUIT LEAD BURRS

This application is a continuation of application Ser. No. 08/367,987, filed Jan. 3, 1995, now abandoned.

TECHNICAL FIELD OF THE INVENTION

This invention relates in general to the field of electronic devices, and more particularly, to an improved method and system for inspecting integrated circuit package leads for burrs and other defects.

BACKGROUND OF THE INVENTION

Integrated circuit packages have leads that connect external circuitry to the internal integrated circuit components. These leads are formed generally of a metal conductor such as copper or aluminum and are cut to a desired shape. In the cutting process, a problem often arises that leads are less than properly cut or formed. For example, a burr or foreign particle may extend from a lead following manufacture of the package. If the integrated circuit package leaves the manufacturing process with this burr or foreign particle, a short circuit or other type of improper circuit operation may occur. Consequently, there is a need to identify lead burrs and other lead surface defects during or immediately after the manufacturing process.

Known techniques for inspecting burrs or other surface defects on an electrical lead involve manually inspecting the lead. In this process, highly skilled inspectors use a magnifying glass or microscope to manually inspect for lead defects. This entails a separate process that is distinct from and additional to other inspections and processes for conditioning bent or deformed leads. The speed of this burr inspection process, therefore, affects the integrated circuit package manufacturing throughput. If it were possible to eliminate this separate, manual, labor intensive process, an improvement in integrated circuit package manufacturing process throughput would result.

SUMMARY OF THE INVENTION

Therefore a need has arisen for a method and system for inspecting integrated circuit package leads which avoids the need for highly skilled inspectors who use labor-intensive, time-consuming burr inspection processes.

A further need exists for a method for inspecting integrated circuit package leads to determine the existence of lead burrs or other surface defects without the need for a separate, manual inspection process that is distinct from the integrated circuit package lead inspection and conditioning portions of the integrated circuit package manufacturing process.

One aspect of the present invention, therefore, is an electrical lead burr inspection method for inspecting an electrical lead for burrs and surface defects using a machine vision lead inspection system. The method includes the steps of forming an image of the electrical lead using the machine vision lead inspection system. A next step is to determine a plurality of edges associated with the electrical lead. Then, the method is to calculate a plurality of scan lines, each corresponding to the contour of a selected one of the plurality of edges. The scan lines are separated from the selected one of the plurality of edges and the image by a preselected distance. The method further involves the step of inspecting each of the scan lines to detect whether a burr image crosses the scan line. This step of the process provides information from which to determine the presence of a burr or surface defect on the electrical lead.

Another aspect of the present embodiment is a burr inspection system that inspects an electrical lead for a burr and that operates in association with a machine vision lead inspection system. The system includes machine vision circuitry for forming an image of the electrical lead. Much of this circuitry may be part of the associated machine vision lead inspection system. Edge detecting instructions associate with the machine vision circuitry for determining a plurality of edges associated with the electrical lead image. In addition, scan line determining instructions associate with the edge detecting instructions for calculating a plurality of scan lines each corresponding to the contour of a selected one of said plurality of edges of the images. The scan lines are further separated from the selected one of the plurality of edges and the image by a preselected distance. Inspecting circuitry of the invention includes instructions for associating with the scan line determining instructions. This permits the system to inspect each of the scan lines to detect whether a burr image crosses a scan line. A burr image crossing a scan line identifies the presence of a burr or foreign particle on the electrical lead.

A technical advantage of the present invention is that it provides a burr inspection method and system that may operate during or immediately after an automatic lead inspection and conditioning process. As a result, the present invention permits determination of a burr or surface defect on the integrated circuit package lead without an additional manual inspection process.

Another technical advantage of the present invention is that it improves a manufacturer's ability to detect foreign material other than simple metal burrs on the integrated circuit package lead. Although some degree of foreign material inspection is possible using conventional manual techniques, the present invention makes detection of much smaller foreign material particles possible.

Another technical advantage of the present invention is that it avoids the need for a skilled operator to manually identify the presence of a burr or surface defect on an integrated circuit package lead. By way of the computerized method that the present invention provides, it is possible to perform the burr and surface defect inspection method automatically. This process is, therefore, much faster and more reliable in many instances than are the known manual inspection techniques.

Note that for simplicity the term "burr" as used herein shall mean, either separately or collectively, a piece of metal that is part of a lead that may be improperly cut, a metallic particle that attaches to a lead, and/or a non-metallic foreign particle. Any one of these burrs could adversely affect electrical connections or operation of the associated integrated circuit package lead. Where it is appropriate to make distinctions among the above defects, they are made herein.

BRIEF DESCRIPTION OF THE DRAWINGS

For a more complete understanding of the present invention and advantages thereof, reference is now made to the following description which is to be taken into consideration together with the accompanying drawings in which like reference numerals indicate like features and wherein:

FIG. 4 illustrates a top view of an integrated circuit package lead that depicts the formation of scan lines according to the present embodiment;

FIG. 5 illustrates an integrated circuit package lead having a burr and the application of the present embodiment for identifying the burr;

FIG. 6 illustrates a flow chart that implements the method of the present embodiment; and FIGS. 7 through 11 illustrate user interface screens that may be associated with the method and system of the present embodiment for automatically inspecting a burr on an integrated circuit package lead.

DETAILED DESCRIPTION OF THE INVENTION

Illustrative embodiments of the present invention are provided in the FIGUREs, like numerals being used to refer to like and corresponding parts of the various drawings.

Figure 1:
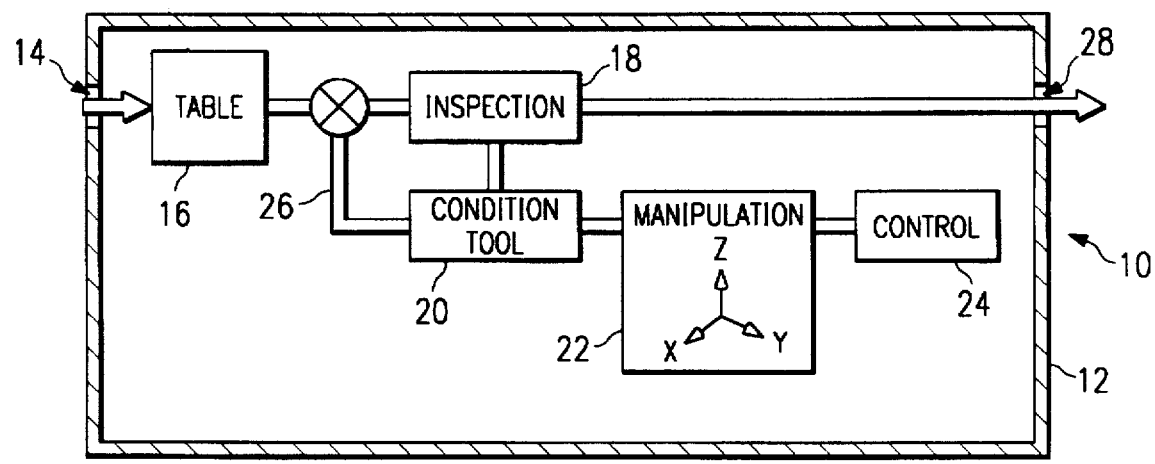
FIG. 1 illustrates a conceptual block diagram of the process flow for the lead inspection and conditioning system of the present embodiment.
Figure 3:
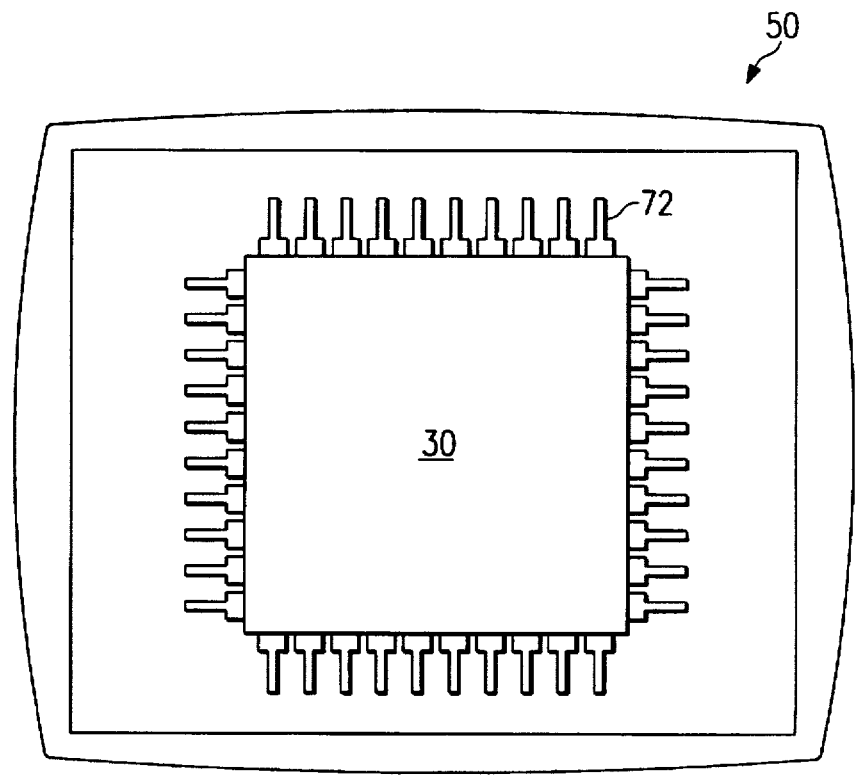
FIG. 3 shows an exemplary screen of a lead inspection and conditioning system monitor for use with the present embodiment to indicate the presence of a burr on one or more leads of an integrated circuit package.
Figure 2:
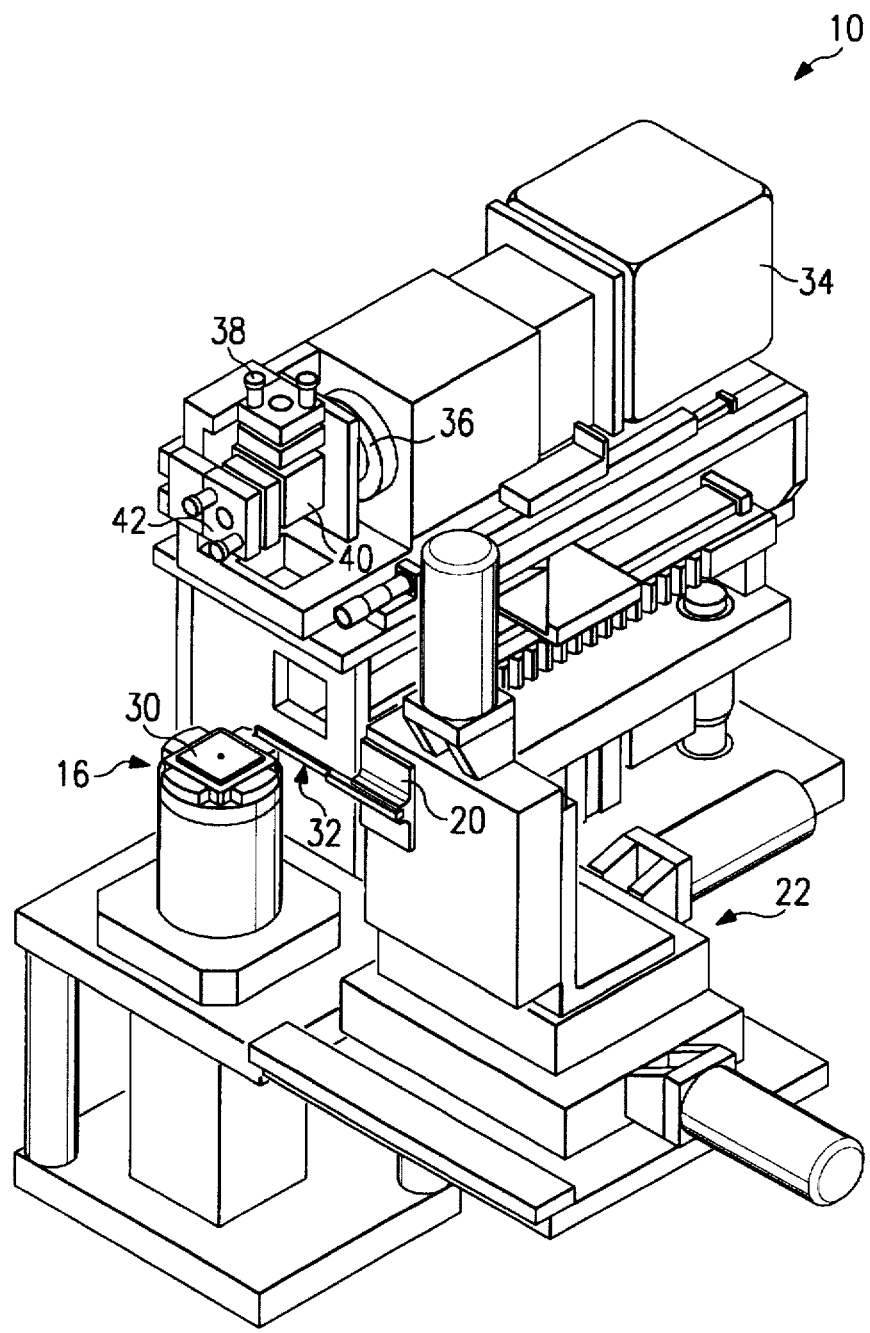
FIG. 2 shows an isometric view of the various operative components of a lead inspection and conditioning system usable in conjunction with the present embodiment.

FIGS. 1 through 3 illustrate an exemplary lead inspection and conditioning system that may use the present embodiment of the invention. For example, the present embodiment may be included in a Texas Instruments Incorporated AT4070 Lead Inspection System, which provides both lead inspection and conditioning for integrated circuit package leads. This system is described in U.S. patent application Ser. No. 08/275,162 by M. Glucksman et al. and entitled Programmable Lead Conditioner, assigned to Texas Instruments Incorporated, and filed on Jul. 14, 1994 (TI-19187). This U.S. Patent Application is here incorporated expressly by reference.

Referring to FIG. 1 to explain the environment of the present embodiment, process flow through a lead inspection and conditioning system 10 is shown schematically as beginning within chassis 12 which contains the components necessary to inspect and condition integrated circuit package electrical leads. At input 14, the integrated circuit package enters lead inspection and conditioning system 10 and is positioned on table 16. While the integrated circuit package is on table 16, lead inspection system 18, inspects its leads to determine whether conditioning is required. If so, then conditioning tool 20 conditions the identified leads. At this point, inspection of the electrical leads according to the concepts of the present invention may also occur. Manipulator 22 has the ability to operate in three dimensions to control conditioning tool 20. Control system 24 controls the operation of manipulator 22. After conditioning, as path 26 indicates, reinspection may occur using inspection system 18. If no further conditioning is required, the integrated circuit package is removed from table 16 and exits lead conditioning system 10 at output 28. If further conditioning is required, on the other hand, conditioning tool 20 will perform the conditioning, and inspection may continue until no further conditioning is required.

Referring to FIG. 2, there is an isometric diagram of one embodiment of a lead inspection system that may employ the present invention. This system 10 includes inspection system 18 that views integrated circuit package 30 on rotary table 16. Conditioning tool 20 includes conditioner arm 32. Conditioning tool 20 connects to manipulator 22. Manipulator 22 has the ability to move conditioning tool 20 in the X, Y, and Z directions for three-dimensional control of conditioner arm 32.

Lead inspection system 18 includes an optical system that has a camera 34 for recording the position of leads on integrated circuit package 30. Camera 34 includes lens 36 which receives an image that image adjustment mechanisms 38, 40 and 42 adjust according to the desired view and image characteristics. Lead conditioning system 10 of the present embodiment also provides the ability to condition integrated circuit packages that are in tubes or other types of device containers. Rotary table 16 may be any station which relatively precisely locates integrated circuit package 30 and which holds integrated circuit package 30 in place.

FIG. 3 depicts a monitor screen 50 that shows the top view image of integrated circuit package 30 including electrical leads 72 from camera 34 of lead inspection system 18. Monitor screen 50 of lead inspection system 18 makes possible more detailed examination of each individual electrical leads 72 of integrated circuit package 30. Monitor 50 may also provide the necessary image from which the present embodiment of the invention may determine the existence of a burr (i.e., a stray piece of electrical lead material, a foreign particle, or other surface defect).

FIG. 4 illustrates an electrical lead image 70 on which to apply the present embodiment of the invention. The electrical lead image 70 of FIG. 4 illustrates two electrical leads 72. Each lead 72 includes a dam bar 76 having height 78 and width 80. Attached to dam bar 76 is lead arm 82. Electrical leads 72 attach to integrated circuit package 30. FIG. 4 also shows the establishment of scan lines 88 and 90 that establish an offset, such as offset 92, from the vertical sides of lead arm 82. In addition, scan lines 94 and 96 establish an offset from the vertical sides of dam bar 76. The present embodiment also provides an offset 98 from package body 100.

FIG. 5 shows the establishment of a scan area for electrical lead 72. Based on scan lines 88 and 90, the vertical sides of a scan area for lead arm 82 may be established. In addition, the present embodiment identifies the location of top edge 102 for lead arm 82. The result is an inverted "T-shaped" scan measure 104 having a center or locus 106 that is centered between scan lines 88 and 90. Locus 108 is a pre-established offset from top edge 102. The automatic operation scan measure 104 passes from the top position that FIG. 5 indicates to the end of scan lines 88 and 90. For dam bar 76, scan measure 110 is centered between scan lines 94 and 96. Similarly, scan measure 110 will pass from the tops of scan lines 94 and 96 to offset 98.

The present embodiment determines the top 102 of lead arm 82 by determining the transition in the image of lead 72 between dark and light. Thus, for example, in the image of lead 72 on monitor 50, lead arm 82 may be dark. The background may be light. By determining the transition from the dark coloration of lead 82 and the light coloration of its background, the exact location of top edge 102 may be determined.

Furthermore, to determine the location of center or locus 106, the present embodiment analyzes the transitions along the sides of lead arm 82. With this information, the burr inspection system calculates the center point between the point at which a dark-to-light transition occurs on the right-hand side of lead arm 82 and the point at which a dark-to-light transition occurs on the left-hand side of lead arm 82. Based on calculations arising from these transitions, the center point 106 may be determined to result in the precise location of locus 106.

FIG. 6 illustrates flow chart 120 that describes certain steps of the method of the present embodiment. Thus, beginning at start block 122, the burr inspection method of the present embodiment moves to block 124 at which the system determines the top 102 of the electrical lead, such as electrical lead 72. Then, the next step is to determine the bottom of electrical lead 72, as step 126 indicates. Based on these determinations, the next step of the method is to calculate scan lines, at block 128, such as scan lines 88 and 90 of electrical lead 72 in FIG. 5. Then, at step 130, the method applies scan measure 104 to scan for a burr such as burr 112 (or other foreign material) along the side of lead arm 82. Step 132 is a query of whether during any portion of step 130 a burr 112 is found.

If no burr 112 is found along the inspected side, whichever side is first inspected, process flow 120 proceeds via path 134 to point 136 where inspection of the opposite side of electrical lead 72 begins. That is, for example, if no burr 112 is found on the right hand side, then the process proceeds to the left hand side of electrical lead 72. The process that flow diagram 120 describes may be similarly conducted to determine the presence of burr 114 along the sides of dam bar 76. If, at step 132, a burr 112 is found, the method of the present embodiment is to then store the burr location for later display, as step 138 indicates. Next, the method and system output results of the inspection, according to step 140.

OPERATION

In operation, the present embodiment may be installed in lead inspection system 18 (See, FIGS. 1 through 3) and become part of that system. The following discussion specifically illustrates operation on the Texas Instruments Incorporated LIS AT4070, but this is by way of example only. There are numerous other lead inspection systems for which the present embodiment has application. In such a system, a first step for applying the present embodiment is system setup. The lead inspection system 18 software requires three new parameters in a parameter file. These include the dam bar length 78, dam bar width 80, and burr scan offset 98. These new parameters should be inserted at the end of the existing parameter file of the lead inspection system 18 software. In addition to the dam bar dimensions, the lead inspection system 18 uses the size of a dam bar 76 to be inspected. The user may define this in the top-view tolerance menu of the lead inspection system 18. FIG. 7 shows this screen from the LIS AT4070. Other systems may have different user interface screens, but generally will accept information of this type.

After determining the device parameters, the next step in operating the present embodiment is to input inspection parameters. The burr inspection system preferably includes an option by which burr inspection operations may be turned on or turned off. A user may turn on this option, for example, in the parameters menu as shown in FIG. 8. These inputs permit the user to select one of at least four options, including an OFF option (wherein no burr inspection occurs) and an ARM option (wherein the method and system inspects for burrs along lead arm 82). In addition, the user may select a DAM BAR option (wherein the burr inspection system inspects for burrs along the side of dam bar 76) and an ARM+DAM option (which enables the system to inspect for burrs both along lead arm 82 and dam bar 76). With one of these selections, preferably after lead inspection occurs, lead inspection system 18 executes the steps described in association with FIG. 6 for determining the presence of a burr or other foreign material that may cause improper operation of lead 72.

To make this information more meaningful, FIG. 9 illustrates another lead inspection system 18 screen that permits mapping defect pixels. The burr inspection method and system of the present embodiment requires very precise pixel information. A pixel defect on monitor 50 of lead inspection system 18 may cause the system of the present embodiment to fail to detect the presence of a burr or foreign material. To avoid that problem, lead inspection system 18 is equipped with a defect pixel map. If a defective pixel is identified, lead inspection system 18 ignores the defect from the pixel. Because most burr defects on a lead, such as burr 112 of lead 72, are larger than a single pixel of lead inspection system 18 screen, the burr will not escape detection with the present embodiment.

To perform defect pixel mapping, according to FIG. 9, the user operating lead inspection system 18 may select "MAINTENANCE" from the main menu, select "INSPECTION" from the maintenance menu, and select "TOP VIEW DIAGS" from the inspection maintenance menu. Then, the user at the top view diagostics menu may select "TERMINAL" to show the screen that appears in FIG. 9. Once the mapping is done, lead inspection system 18 prompts the user to end the terminal mode. At this point, lead inspection system 18 is prepared to perform the burr inspection process of FIG. 6. From this point, as long as no additional tolerance or inspection parameters are necessary, the present embodiment works within lead inspection system 18 to generate lead inspection data for any number of integrated circuit package leads 72 and integrated circuit packages 30.

Inspection results may be obtained in various formats from a lead inspection system 10 equipped with the present embodiment of the invention. During the run mode, for example, a burr defect may be displayed in a production screen under the "TOP VIEW DATA" screen as appears in FIG. 10. Note the SIDE and PIN entries at the output 142. The value nn is the number of burrs found on that side and S1 is the side with the largest number of burrs found. In addition, as shown in FIG. 11, the burr inspection results may also be seen in a statistical report that lead inspection system 18 provides. This output may be from monitor 50 or in a printed paper report to the user.

An important detail concerning the embodiment of the invention as applied to lead inspection system 18 is that the minimum size of a detectable burr or foreign particle depends largely on how well the lead inspection system 18 can see it. In general, a burr must be at least two pixels wide for system detection. For example, on a high magnification setting (e.g., 1.4 mils per pixel), the minimum size may equal 2.8 mils. On a low magnification setting (e.g., 2 mils per pixel), the minimum size is approximately 4 mils.

Because of a large number of inspections necessary for each integrated circuit package 30, the addition of the present burr inspection algorithm may reduce overall lead inspection system 18 throughput. On the other hand, because a separate, manual lead inspection process is eliminated with the present embodiment, the overall throughput for integrated circuit package inspection is likely to improve.

In operating the present embodiment, there may be certain decisions that a user may make to optimize system performance. For example, the decision to accept or reject a defect or burr is dependent on the parameters that the user sets. However, due to system video noise or the imperfection of the particular part, if lead inspection system 18 includes the present embodiment, it may reject a borderline lead that a manual process may accept.

There are, therefore, some parameters that the user should consider to prevent the present embodiment from becoming too restrictive. If the burr exits, system indicates that a burr is detected around the top of dam bar 76, for example, where no real burr exists, this could mean that the scan line of lead arm 82 comes down too far into the dam bar 76 area. The user may cure this problem by increasing the dam bar length 78 in the parameter file. This prevents the burr inspection system from scanning into the dam bar 76 area and falsely detecting dam bar 76 as a burr.

In some systems, electrical lead 72 may appear crooked to the top view as a result of camera perspective angle. Since the method of the present embodiment scans electrical lead 72 in a straight line along the side, it may cut across a crooked area and falsely detect that there is a burr. To overcome this problem, the user may move scan lines 88 or 90, for example, further away from electrical lead 72 by increasing the burr size parameter of the tolerance menu as appears in FIG. 7. A disadvantage of taking this step, however, is that the system may miss a smaller burr.

Still another operational consideration is that a method may falsely detect a burr along the package body 100 edge of dam bar 76. This may happen because scan line 94 or 96 of dam bar 76 comes down and touches package body 100. To overcome this problem, the user may increase the "burr scan offset" parameters in the parameter file. This instructs the burr inspection system to set the scan line further out from package body 100 to avoid scanning into the body.

In summary, the present invention provides an electrical lead burr inspection method for inspecting an electrical lead for a burr using a machine vision lead inspection system. The method includes the steps of, and the system includes the circuitry and instructions for, forming an image of the electrical lead using the machine vision lead inspection system. The next function is to determine a plurality of edges associated with the electrical lead. Then, the present invention calculates a plurality of scan lines, each corresponding to the contour of a selected one of the plurality of edges. The scan lines are further separated from the selected one of the plurality of edges and the image by a preselected distance. The invention uses this information and inspects each of the scan lines to detect whether a burr image crosses the scan line to determine the presence of a burr on the electrical lead.

Although the present invention has been described in detail, it should be understood that various changes, substitutions and alterations can be made hereto without departing from the spirit and scope of the invention as defined by the appended claims.

What is claimed is:

1. An electrical lead burr inspection method for automatically inspecting an electrical lead for a burr using a machine vision lead inspection system, comprising the steps of:
   forming a pixel image of an electrical lead using the machine vision lead inspection system;
   determining a plurality of vertical lead edges associated with the electrical lead by determining dark-to-light transitions associated with the lead pixel image;
   establishing a plurality of vertical scan lines, each of the scan lines corresponding to the contour of a respective one of the lead edges, each of the scan lines further separated from the respective one of the lead edges by a preselected burr tolerance distance of at least two pixels; and
   scanning along the scan lines to detect whether a burr image crosses the respective scan line for determining the presence of a burr on the electrical lead.

2. The method of claim 1, wherein the burr comprises a piece of the electrical lead.

3. The method of claim 1, wherein the burr comprises a foreign particle on the electrical lead.

4. A method for inspecting an electrical lead for a burr using a machine vision lead inspection system, wherein the electrical lead has a lead arm and a dam bar, the method comprising the steps of:
   forming a pixel image of an electrical lead using the machine vision lead inspection system; the image comprising a lead arm image and a dam bar image;
   determining a plurality of vertical lead arm edges associated with the lead arm image by determining dark-to-light transitions associated with the lead arm image;
   determining a plurality of vertical dam bar edges associated with the dam bar image;
   establishing a plurality of vertical lead arm scan lines, each of the lead arm scan lines corresponding to the contour of a respective one of the lead arm edges, each of the lead arm scan lines further separated from the respective one of the lead arm edges by a preselected burr tolerance distance of at least two pixels;
   establishing a plurality of vertical dam bar scan lines, each of the dam bar scan lines corresponding to the contour of a respective one of the dam bar edges, each of the dam bar scan lines further separated from the respective one of the dam bar edges by a preselected burr tolerance distance of at least two pixels; and
   automatically scanning along each of the lead arm scan lines and dam bar scan lines to detect whether a burr image crosses the respective scan line for determining the presence of a burr on the electrical lead.

5. The method of claim 1, wherein said electrical lead burr inspecting step is performed in association with a process for automatically inspecting the presence of a bent lead.

6. The method of claim 5, further wherein said electrical lead burr inspecting step is performed in association with a process for automatically conditioning any bent leads identified by said bent lead inspecting process.

7. An electrical lead burr inspection method for inspecting an electrical lead for a burr using a machine vision lead inspection system, comprising the steps of:
   forming a pixel image of an electrical lead using the machine vision lead inspection system; the electrical lead image being displayed on a monitor screen having a plurality of pixel locations;
   determining a plurality of vertical lead edges associated with the electrical lead image;
   establishing a plurality of vertical scan lines, each of the scan lines corresponding to the contour of a respective one of the lead edges, each of the scan lines further separated from the respective one of the lead edges by a preselected burr tolerance distance of at least two pixels;
   scanning along each of the scan lines to detect whether a burr image crosses the respective scan line for determining the presence of a burr on the electrical lead; and
   mapping defective pixel locations on the image formed by the machine vision lead inspection system for avoiding faulty detection of a burr on the electrical lead.

8. A burr inspection system for inspecting an electrical lead for a burr in association with the operation of a machine vision lead inspection system, comprising:
   machine vision circuitry forming an electrical lead pixel image of the electrical lead using the machine vision lead inspection system;
   edge detecting instructions associated with said machine vision circuitry for determining a plurality of vertical lead edges associated with the electrical lead image;

scan line determining instructions for establishing a plurality of vertical scan lines, each scan line corresponding to the contour of a respective one of said lead edges, each of said scan lines further separated from said respective one of said lead edges by a preselected burr tolerance distance of at least two pixels; and inspecting circuitry for scanning along each of said scan lines to detect whether a burr image crosses said respective scan line for determining the presence of a burr on the electrical lead.

9. The system of claim 8, wherein the burr comprises a piece of the electrical lead.

10. The system of claim 8, wherein the burr comprises a foreign particle on the electrical lead.

11. A burr inspection system for inspecting an electrical lead for a burr in association with the operation of a machine vision lead inspection system, wherein the electrical lead comprises a lead arm and a dam bar, comprising:

machine vision circuitry forming an electrical lead pixel image of the electrical lead using the machine vision lead inspection system; said electrical lead image comprising a lead arm image and a dam bar image;

edge determining instructions associated with said machine vision circuitry for determining a plurality of lead arm vertical edges associated with the lead arm image and for determining a plurality of dam bar vertical edges associated with the dam bar image;

scan line determining instructions for establishing a plurality of lead arm vertical scan lines, each of said lead arm scan lines corresponding to the contour of a respective one of the lead arm edges, each of said lead arm scan lines further separated from said respective one of said lead arm edges by a preselected burr tolerance distance of at least two pixels;

said scan line determining instructions further comprising instructions for establishing a plurality of dam bar vertical scan lines, each of said dam bar scan lines corresponding to the contour of a respective one of the dam bar edges, each of said dam bar scan lines further separated from said respective one of said dam bar edges by a preselected burr tolerance distance of at least two pixels; and inspection circuitry for automatically scanning each of said lead arm scan lines and dam bar scan lines to detect whether a burr image crosses said respective scan line for determining the presence of a burr on the electrical lead.

12. The system of claim 8, further comprising instructions associated with said machine vision circuitry for performing said electrical lead burr inspection in association with a process for inspecting the presence of a bent lead.

13. The system of claim 12, further comprising instructions associated with said machine vision circuitry for performing said electrical lead burr inspection in association with a process for automatically conditioning any bent leads identified by said bent lead inspecting process instructions.

14. A burr inspection system for inspecting an electrical lead for a burr in association with the operation of a machine vision lead inspection system, comprising:

a monitor screen having a plurality of pixel locations;

machine vision circuitry forming an electrical lead pixel image of the electrical lead on the monitor screen using the machine vision lead inspection system;

edge detecting instructions associated with said machine vision circuitry for determining a plurality of vertical edges associated with the electrical lead image;

scan line determining instructions for establishing a plurality of vertical scan lines, each scan line corresponding to the contour of a respective one of said edges, each of said scan lines further separated from said respective one of said edges by a preselected burr tolerance distance of at least two pixels;

inspecting circuitry for scanning each of said scan lines to detect whether a burr image crosses said respective scan line for determining the presence of a burr on the electrical lead; and defect pixel mapping instructions associated with the machine vision circuitry for mapping defect pixel locations on said electrical lead image formed by said machine vision lead inspection system for avoiding faulty detection of a burr on the electrical lead.

15. A lead inspection and conditioning system for inspecting and conditioning an electrical lead, comprising:

machine vision circuitry forming an electrical lead pixel image of the electrical lead;

bent lead inspection circuitry for inspecting the presence of a bent lead based on said electrical lead image of the electrical lead;

a lead conditioning mechanism for conditioning a bent lead; and burr inspection circuitry for operation in association with said bent lead inspection circuitry and said lead conditioning mechanism and comprising:

edge detecting instructions associated with said machine vision circuitry for determining a plurality of lead edges associated with the electrical lead image;

scan line determining instructions for calculating a plurality of scan lines, each scan line corresponding to the contour of a respective one of said lead edges, each of said scan lines further separated from said respective one of said lead edges by a preselected burr tolerance distance of at least two pixels; and inspecting circuitry for scanning each of said scan lines to detect whether a burr image crosses said respective scan line for determining the presence of a burr on the electrical lead.

16. The system of claim 15, wherein the burr comprises a piece of the electrical lead.

17. The system of claim 15, wherein the burr comprises a foreign particle on the electrical lead.

18. A lead inspection and conditioning system for inspecting and conditioning an electrical lead having a lead arm and a dam bar, comprising:

machine vision circuitry forming an electrical lead arm pixel image and a dam bar pixel image;

bent lead inspection circuitry for inspecting the presence of a bent lead based on said electrical lead arm image;

a lead conditioning mechanism for conditioning a bent lead; and burr inspection circuitry for operation in association with said bent lead inspection circuitry and said lead conditioning mechanism and comprising:

edge detecting instructions for determining a plurality of lead arm edges associated with the lead arm image and for determining a plurality of dam bar edges associated with the dam bar image;

scan line determining instructions for establishing a plurality of lead arm scan lines, each of said lead arm scan lines corresponding to the contour of a respective one of the lead arm edges, each of said lead arm scan lines further separated from said respective one of said lead arm edges by a preselected burr tolerance distance of at least two pixels;

said scan line determining instructions further comprising instructions for establishing a plurality of dam bar scan lines, each of said dam bar scan lines corresponding to the contour of a respective one of the dam bar edges, each of said dam bar scan lines further separated from said respective one of said dam bar edges by a preselected burr tolerance distance of at least two pixels; and inspection circuitry for automatically scanning each of said lead arm scan lines and dam bar scan lines to detect whether a burr image crosses said respective scan line for determining the presence of a burr on the electrical lead.

19. The system of claim 15, further comprising instructions associated with said machine vision circuitry for automatically performing said electrical lead burr inspection in association with a process for automatically inspecting the presence of a bent lead and conditioning any identified bent leads.

20. A lead inspection and conditioning system for inspecting and conditioning an electrical lead, comprising:

a monitor screen having a plurality of pixel locations;

machine vision circuitry forming an electrical lead pixel image of the electrical lead on the monitor screen;

bent lead inspection circuitry for inspecting the presence of a bent lead based on said electrical lead image of the electrical lead;

a lead conditioning mechanism for conditioning a bent lead; and burr inspection circuitry for operation in association with said bent lead inspection circuitry and said lead conditioning mechanism and comprising:

edge detecting instructions for determining a plurality of lead arm edges associated with the lead arm image and for determining a plurality of dam bar edges associated with the dam bar image;

scan line determining instructions for establishing a plurality of lead arm scan lines, each of said lead arm scan lines corresponding to the contour of a respective one of the lead arm edges, each of said lead arm scan lines further separated from said respective one of said lead arm edges by a preselected burr tolerance distance of at least two pixels;

inspecting circuitry for scanning each of said scan lines to detect whether a burr image crosses said respective scan line for determining the presence of a burr on the electrical; and defect pixel mapping instructions associated with the machine vision circuitry for mapping defect pixel locations on said electrical lead image formed by said machine vision lead inspection system for avoiding faulty detection of a burr on the electrical lead.

21. A method for automatically inspecting electrical leads of an integrated circuit package for burrs, comprising the steps of:

forming a pixel image of an electrical lead of the package;

determining first and second lead side edges associated with the image;

establishing first and second side edge scan lines that establish burr tolerance offsets of at least two pixels, respectively, from the first and second side edges; and scanning along the side edge scan lines to detect whether a burr image crosses the respective scan line for determining the presence of a corresponding burr on the electrical lead.

22. The method of claim 21, wherein the electrical lead comprises a lead arm and a dam bar; wherein the image forming step comprises forming a lead arm image and a dam bar image; and wherein the determining, establishing and scanning steps comprise:

determining first and second lead arm side edges associated with the lead arm image;

determining first and second dam bar side edges associated with the dam bar image;

establishing first and second lead arm side edge scan lines that establish offsets of at least two pixels, respectively, from the first and second lead arm side edges;

establishing first and second dam bar arm side edge scan lines that establish offsets of at least two pixels, respectively, from the first and second dam bar side edges; and scanning along the lead arm side edge scan lines and dam bar side edge scan lines to detect whether a burr image crosses the respective lead arm scan line or dam bar scan line for determining the presence of a corresponding burr on the electrical lead.

* * * * *